(12) United States Patent
Hayashi et al.

(10) Patent No.: US 7,417,319 B2
(45) Date of Patent: Aug. 26, 2008

(54) SEMICONDUCTOR DEVICE WITH CONNECTING VIA AND DUMMY VIA AND METHOD OF MANUFACTURING THE SAME

(75) Inventors: Toshiya Hayashi, Kanagawa (JP); Tatsurou Tezuka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 254 days.

(21) Appl. No.: 11/136,405

(22) Filed: May 25, 2005

(65) Prior Publication Data

US 2005/0266677 A1 Dec. 1, 2005

(30) Foreign Application Priority Data

May 25, 2004 (JP) ............... 2004-155303

(51) Int. Cl.
*H01L 23/48* (2006.01)
(52) U.S. Cl. ............... 257/774; 257/758; 257/E21.577
(58) Field of Classification Search ........... 257/774, 257/758
See application file for complete search history.

(56) References Cited

U.S. PATENT DOCUMENTS

| | | | |
|---|---|---|---|
| 5,793,113 A * | 8/1998 | Oda | 257/774 |
| 6,153,510 A * | 11/2000 | Ishibashi | 438/622 |
| 6,287,948 B1 * | 9/2001 | Ushiyama | 438/606 |
| 2003/0211716 A1 * | 11/2003 | Segawa | 438/585 |
| 2004/0152256 A1 * | 8/2004 | Noguchi et al. | 438/250 |

FOREIGN PATENT DOCUMENTS

| | | |
|---|---|---|
| CN | 1459842 | 12/2003 |
| JP | 2003-218199 | 7/2003 |
| JP | 2004-134610 | 4/2004 |

* cited by examiner

*Primary Examiner*—Thanh Nguyen
(74) *Attorney, Agent, or Firm*—Young & Thompson

(57) ABSTRACT

An underlying interconnect including a first barrier metal layer, an interconnect metal layer and a second barrier metal layer is formed on a semiconductor substrate, and an interlayer dielectric is formed thereon. Etching is performed with a photoresist defining an opening for a first via, and an opening for a second via having a larger bottom area than the first via opening, so as to form a first via hole and a second via hole in the interlayer dielectric. Since the second via hole has a larger diameter than the second via hole, the second via hole is opened up prior to the second via hole, and the underlying interconnect is exposed first at the bottom of the second via hole.

16 Claims, 6 Drawing Sheets

SEMICONDUCTOR DEVICE WITH CONNECTING VIA AND DUMMY VIA AND METHOD OF MANUFACTURING THE SAME

This application is based on Japanese patent application No. 2004-155303, the content of which is incorporated hereinto by reference.

BACKGROUND OF THE INVENTION

1. Field of the Invention

The present invention relates to a semiconductor device that includes a via for electrically connecting an underlying metal layer to another conductor, and a method of manufacturing such a semiconductor device.

2. Description of the Related Art

In a semiconductor device, a via serves to connect an interconnect, constituted of for example aluminum, to an electrode of a chip located in another layer. Such the via is formed by filling a conductive material in a via hole.

However, forming the via often incurs a problem that contact resistance between an interconnect and the via is increased. In order to solve this problem, Japanese Laid Open patent publication No. 2004-134610 proposes a technique of supplying a fluorinated gas which has a reducing effect in the via hole prior to filling the via hole with a metal material such as tungsten (W), so as to remove substances that cause the increase in resistance.

SUMMARY OF THE INVENTION

According to the present invention, there is provided a semiconductor device comprising a semiconductor substrate; a metal layer provided on the semiconductor substrate; an insulating layer provided on the metal layer; a first via provided in the insulating layer in connection with the metal layer, for electrically connecting the metal layer to another conductor; and a second via provided in the insulating layer in connection with the metal layer, and having a larger diameter than the first via.

The increase in contact resistance between an underlying interconnect and a via can be attributed to the fact that the interconnect is prone to be charged when the underlying interconnect is connected to a large capacitance, or is a floating interconnect larger than 100 μm$^2$, and that the charge that has accumulated in the interconnect reacts to an etching gas or a barrier metal material when forming a via hole that reaches the underlying interconnect, thereby causing deterioration of the associated materials. The semiconductor device constructed as above removes such a charge from the metal layer such as the interconnect, prior to forming a via hole for a via for connecting the metal layer and another conductor, thus prevents an increase in contact resistance between the underlying metal layer and the via.

In the semiconductor device according to the present invention, the metal layer may be an interconnect or an electrode. The first via serves to electrically connect the underlying metal layer to another conductor. The second via is formed by filling a conductive material in an opening that is formed at the same time when opening the via hole for the first via in the insulating layer, such that the underlying metal layer is exposed earlier in this opening than in the via hole for the first via, to thereby serve to remove a charge of the metal layer. The second via is located to be juxtaposed to the first via.

The semiconductor device may comprise two or more first vias, in which case the first vias are made in a generally equal diameter. Also, the semiconductor device may comprise two or more second vias.

The insulating layer may be an interlayer dielectric popularly employed in the related art, such as an oxide layer, a nitride layer or an organic material layer.

Figure 6A:
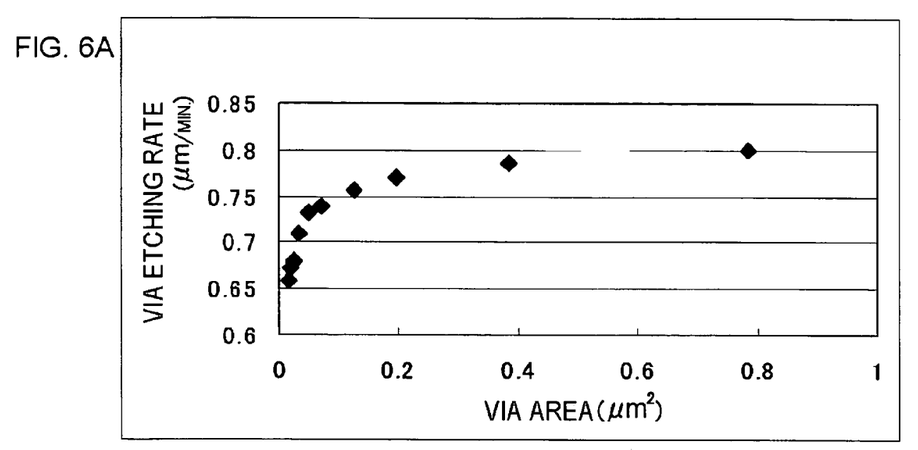
FIGS. 6A and 6B are graphs showing a relation between a via hole size and an etching rate on an insulating layer during formation of a via hole.
Figure 6B:
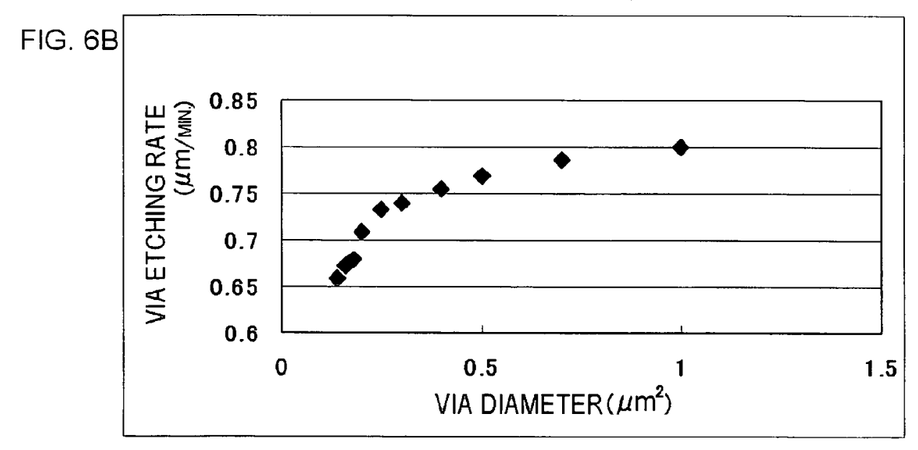

FIGS. 6A and 6B are graphs showing a relation between a via hole size and an etching rate on an insulating layer during formation of a via hole. FIG. 6A shows a relation between the area size of the via and the etching rate, while FIG. 6B shows a relation between the via diameter and the etching rate. Here, a silicon oxide layer was employed as the insulating layer, and $C_4F_8$ as the etching gas.

As is apparent from FIGS. 6A and 6B, the larger the via area or the via diameter is, the higher etching rate is obtained. In other words, it has been proven that the larger the via area or the via diameter is, the faster the via hole is opened up. It is based on such finding with respect to formation of a via hole, that the present inventors have achieved this invention.

According to the present invention, the second via having a larger diameter, hence a larger area than the first via, is provided by the side of the first via, on the metal layer. As already proven regarding the formation of a via hole in which to fill a via material, the via hole having a larger area is formed faster. Therefore, when the via hole for the first via and another via hole for the second via are formed as in the semiconductor device of the present invention, the metal layer is exposed first at a bottom portion of the second via hole, since the second via hole is opened up first. This provokes a reaction of the etching gas with the metal layer at the bottom portion of the second via hole, by which the charge that may have been accumulated on the metal layer is removed. When the metal layer is subsequently exposed at a bottom portion of the first via hole, the metal layer is no longer charged, and therefore the metal layer can be prevented from deterioration at the bottom portion of the first via hole. Consequently, the contact resistance between the first via and the underlying metal layer can be inhibited from increasing.

In the semiconductor device according to the present invention, the second via may be a dummy via not electrically connected to another conductor.

As stated above, the second via is formed by filling a conductive material in the opening (the second via hole) provided for removing a charge from the underlying metal layer prior to forming the first via hole. In other words, it is not an object of forming the second via to provide connection between the underlying metal layer and another conductor, and hence the second via does not have to be electrically connected to another conductor. This does not, however, restrict a location for the second via, but the second via may also be electrically connected to another conductor. Here, another conductor may be a metal layer provided in an upper layer, for example. In this case, since electrical connection between the underlying metal layer and such another conductor is achieved through the first via, the metal layer and such another conductor can be electrically connected efficiently, even though high contact resistance exists between the second via and the underlying metal layer.

In the semiconductor device according to the present invention, the metal layer may include an interconnect metal layer and a barrier metal layer provided on the interconnect metal layer, and the first via and the second via may be provided on the barrier metal layer.

The interconnect metal layer may be constituted of aluminum, copper, silver, or an alloy containing one or more of these metals. The barrier metal layer may include a titanium nitride layer. Accordingly, the metal layer may be structured so as to include an aluminum interconnect on which a titanium nitride layer is provided as the barrier metal layer. In a structure like this, the deterioration of the metal layer (titanium nitride layer) is prone to be incurred when forming the via hole. However, since the metal layer is no longer charged at the time of forming the first via hole according to the present invention, the metal layer exposed at the bottom portion of the first via hole can be exempted from deterioration. Consequently, the present invention enables preventing an increase in contact resistance between the metal layer and the first via.

In the semiconductor device according to the present invention, the metal layer may include aluminum, copper, silver, or polysilicon. The metal layer may also be an interconnect constituted of aluminum, copper, silver, or an alloy containing one or more of these metals, or an electrode constituted of polysilicon.

In the semiconductor device according to the present invention, the first via and the second via may include tungsten. Also, the via may be formed with a similar material to that which constitutes the metal layer.

According to the present invention, there is provided a method of manufacturing a semiconductor device, comprising forming a metal layer on a semiconductor substrate; forming an insulating layer on the metal layer; performing an etching utilizing a mask defining a predetermined pattern, so as to form in the insulating layer a first via hole, and a second via hole having a larger diameter than the first via hole, and to thereby expose an upper surface of the metal layer; wherein the performing the etching includes performing the etching such that the metal layer is exposed first at a bottom portion of the second via hole than in the first via hole.

In the method thus arranged, the first via hole is provided with an object of forming the first via for electrically connecting the underlying metal layer to another conductor. The first via is formed upon filling the first via hole with a conductive material. The second via hole is formed at the same time with the formation of the first via hole, in the insulating layer, with an object to expose therein the underlying metal layer via hole earlier than in the first via hole, to thereby remove a charge from the metal layer. The second via is formed upon filling the second via hole with a conductive material.

In the method according to the present invention, the performing the etching may include performing an etching utilizing an etching gas that contains a halogen.

When utilizing an etching gas containing a halogen such as fluorine, the deterioration is prone to be caused during the formation of the via hole. However, since the metal layer is no longer charged at the time of forming the first via hole in which to form the first via according to the present invention, the metal layer exposed at the bottom portion of the first via hole can be exempted from deterioration. Consequently, the present invention enables preventing an increase in contact resistance between the metal layer and the first via.

According to the present invention, there is provided a method of manufacturing a semiconductor device, comprising forming a metal layer on a semiconductor substrate; forming an insulating layer on the metal layer; performing an etching utilizing a mask defining a predetermined pattern, so as to form a first via hole and a second via hole in the insulating layer, and to thereby expose an upper surface of the metal layer; filling a conductive material in the first via hole and in the second via hole so as to form a first via and a second via; and forming on the first via a conductor connected to the first via but not connected to the second via; wherein the step of exposing an upper surface of the metal layer includes performing the etching under such a condition that causes the metal layer to be exposed earlier at a bottom portion of the second via hole than in the first via hole.

In the method thus arranged, the first via hole is provided with an object of forming the first via for electrically connecting the underlying metal layer to another conductor. The second via hole is formed at the same time with the formation of the first via hole, in the insulating layer, with an object to expose therein the underlying metal layer via hole earlier than in the first via hole, to thereby remove a charge from the metal layer. For such purpose, nature of the insulating layer, a diameter of the first via hole and the second via hole, as well as an etching condition is appropriately determined so as to remove the second via hole prior to the first via hole, and thus to expose the metal layer at a bottom portion of the second via hole earlier than in the first via hole. In a example the diameter of the second via hole is set to be larger than that of the first via hole as already stated, so as to remove the second via hole prior to the first via hole. However, the present invention is not limited to such arrangement, but may include modifying other conditions so as to achieve a similar effect. For example, the second via hole may be formed in an insulating layer that provides a higher etching rate from the etching gas to be employed, and the first via hole may be formed in an insulating layer that provides a lower etching rate from the same etching gas. Such arrangement can also cause the second via hole to be removed prior to the first via hole.

Consequently, the present invention allows minimizing via resistance with respect to a via that electrically connects an underlying metal layer to another conductor.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

FIGS. 1A to 1C, 2D to 2F and 3 are schematic cross-sectional views sequentially showing a manufacturing process of a semiconductor device according to an embodiment of the present invention.

Figure 1A:
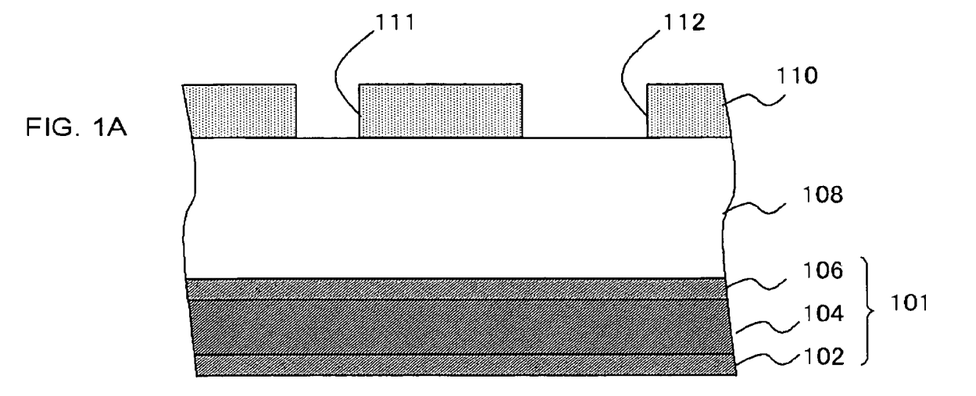
FIGS. 1A to 1C are schematic cross-sectional views sequentially showing a manufacturing process of a semiconductor device according to an embodiment of the present invention.

Firstly, a first barrier metal layer 102 is formed on an SiOx layer (not shown) provided on a semiconductor substrate (not shown). The first barrier metal layer 102 may be composed of a titanium (Ti) film and a titanium nitride (TiN) film, or made of a TiN film alone. Then an interconnect metal layer 104 is formed on the first barrier metal layer 102. The interconnect metal layer 104 may be made up of a low resistance metal such as aluminum, copper, silver or an alloy containing one or more of these. On the interconnect metal layer 104, a second barrier metal layer 106 is formed. The second barrier metal layer 106 may be composed of a titanium (Ti) film and a titanium nitride (TiN) film, or made of a TiN film alone, as same as the first barrier metal layer. The first barrier metal layer 102, the interconnect metal layer 104, and the second barrier metal layer 106 may be formed by a sputtering process for example. This is followed by patterning of the first barrier metal layer 102, the interconnect metal layer 104, and the second barrier metal layer 106 in a predetermined layout. In this way, formation of an underlying interconnect 101 is completed. According to the present embodiment, the underlying interconnect 101 may be an interconnect of a large capacitance having an area of approx. 100 μm$^2$.

Thereafter, an interlayer dielectric 108 is formed on the second barrier metal layer 106. The interlayer dielectric 108 may be made up of a low dielectric film, in other word a low-k film, such as an oxide film, a nitride film, or an organic material film. On the interlayer dielectric 108, a photoresist 110 defining an opening 111 for a first via (hereinafter referred to as a first via opening) and an opening 112 for a second via (hereinafter referred to as a second via opening) is provided. Here, the second via opening 112 is formed with a larger bottom area than the first via opening 111. At this stage, the semiconductor device shown in FIG. 1A is obtained. In the present embodiment, the first via is provided with an object to electrically connect the underlying interconnect 101 to an upper layer interconnect to be subsequently described. The second via herein is a dummy via not involved in connection of the underlying interconnect 101 to the upper layer interconnect.

Figure 1B:
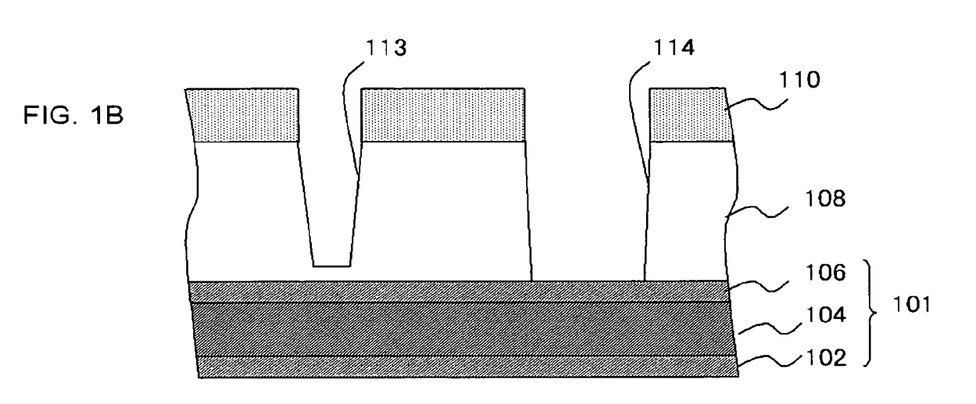

Referring now to FIG. 1B, an etching process is performed utilizing an etching gas, and the photoresist 110 as the mask, so as to form a first via hole 113 and a second via hole 114 in the interlayer dielectric 108. Examples of an applicable etching gas include a CF family gas such as $C_4F_8$, $C_5F_8$, $CH_2F_2$, $CHF_3$, $CF_4$, $C_2F_6$, $C_3F_8$, or an F family such as $SF_6$ or $NF_3$. In particular, $C_4F_8$, $C_5F_8$, $CH_2F_2$, and $CHF_3$ are preferably employed.

In this process, since the second via opening 112 is formed to have a larger bottom area than the first via opening 111, the second via hole 114 is opened up faster than the first via hole 113. Accordingly, the second via hole 114 reaches the second barrier metal layer 106 before the first via hole 113 reaches the second barrier metal layer 106, as shown in FIG. 1B. In the case where the second barrier metal layer 106 is charged at this stage, the second barrier metal layer 106 reacts with the etching gas upon being exposed, to thereby incur deterioration. According to this embodiment, however, since the second barrier metal layer 106 is exposed in the second via hole 114 earlier than in the first via hole 113, the deterioration of the second barrier metal layer 106 takes place at the bottom portion of the second via hole 114, when the second barrier metal layer 106 is charged.

Figure 1C:
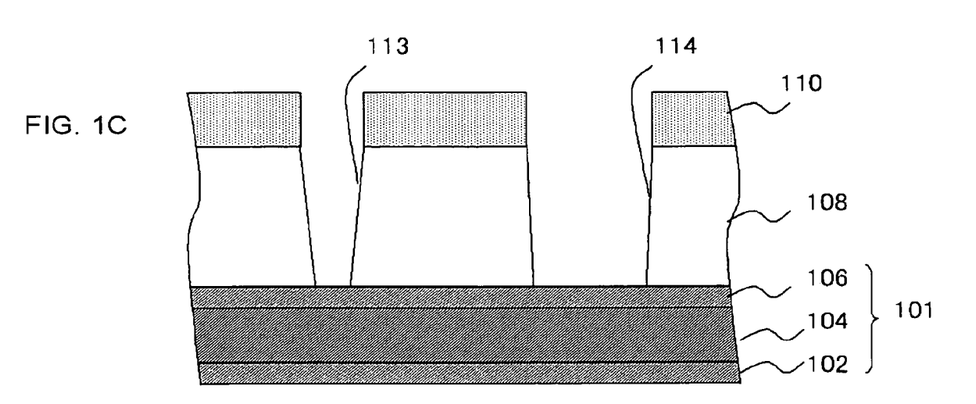

The etching process is still continued, until the second barrier metal layer 106 is exposed at the bottom portion of the first via hole 113 (FIG. 1C). As stated above, even though the second barrier metal layer 106 has been charged prior to the etching process, the second barrier metal layer 106 is exposed first at the bottom portion of the second via hole 114 and reacts with the etching gas, before being exposed at the bottom portion of the first via hole 113. Accordingly, when the second barrier metal layer 106 is exposed at the bottom portion of the first via hole 113, the second barrier metal layer 106 is no longer charged. Consequently, the process prevents the deterioration of the second barrier metal layer 106 at the bottom portion of the first via hole 113.

Figure 2D:
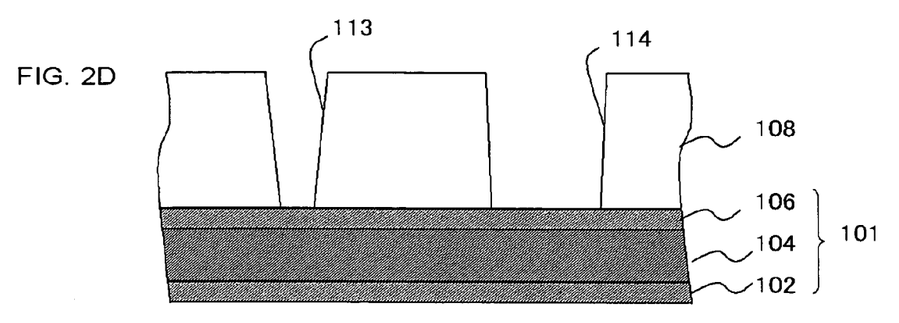
FIGS. 2D to 2F are schematic cross-sectional views sequentially showing a manufacturing process of a semiconductor device according to the embodiment.

Then for example a plasma ashing process is performed, to remove the photoresist 110 (FIG. 2D).

Figure 2E:
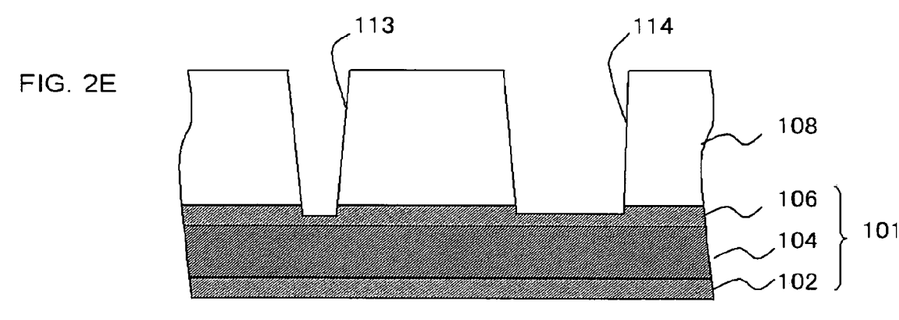

After that, a portion of the second barrier metal layer 106 that is exposed at the bottom portion of the first via hole 113 and the second via hole 114 is scraped off, for example by an RF (high frequency wave) sputter-etching process (FIG. 2E). This eliminates an oxide such as titanium oxide ($TiO_n$).

Figure 2F:
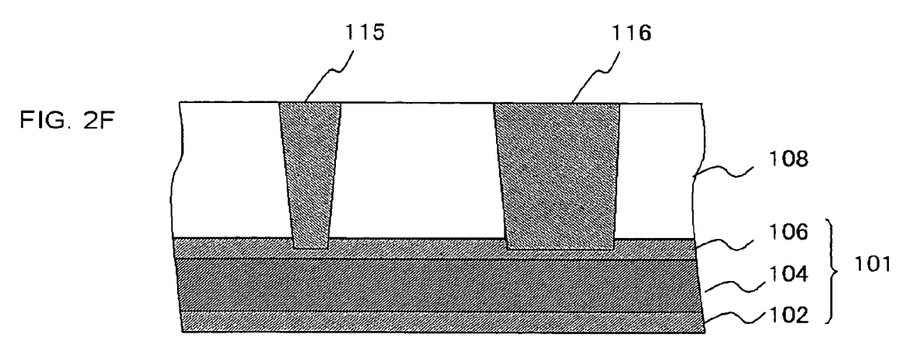

Proceeding to FIG. 2F, a conductive material is filled in the first via hole 113 and the second via hole 114, thus to form the first via 115 and the second via 116. The first via 115 and the second via 116 may be formed as followings for example. A barrier metal layer such as a TiN film is formed in the first via hole 113 and the second via hole 114 by sputtering, and a CVD process is performed to fill a via material such as W in the first via hole 113 and the second via hole 114. Then CMP (Chemical mechanical polishing) is performed so as to expose the interlayer dielectric 108, to thereby remove the barrier metal and the via material located outside the first via hole 113 and the second via hole 114. In this way, the first via 115 and the second via 116 are completed.

Figure 3:
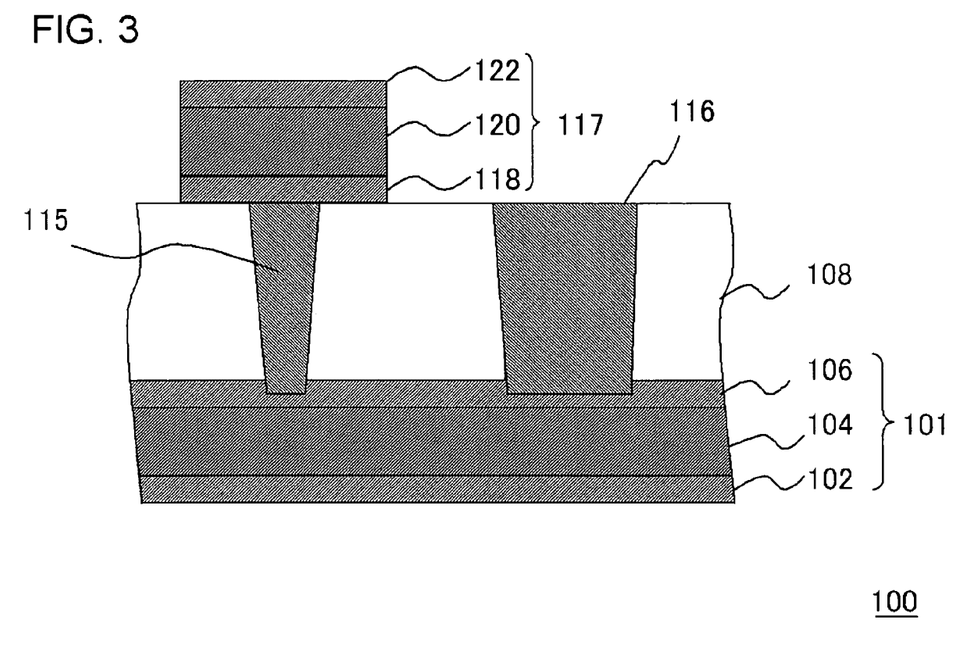
FIG. 3 is a schematic cross-sectional view showing a semiconductor device according to the embodiment.

After the above, an upper layer interconnect 117 including a third barrier metal layer 118, a second interconnect metal layer 120 and a fourth barrier metal layer 122 of a predetermined pattern is formed on the first via 115, as shown in FIG. 3. This step completes the formation of a semiconductor device 100 in which the underlying interconnect 101 and the upper layer interconnect 117 are connected through the first via 115.

According to this embodiment, the second via 116 is not formed with an object to provide connection between the underlying interconnect 101 and the upper layer interconnect 117, and hence the second via 116 does not have to be electrically connected to the upper layer interconnect 117. This does not, however, restrict a location for the second via 116, and the second via 116 may be located at any position as long as it is electrically connected to the underlying interconnect 101. For example, the upper layer interconnect 117 may be formed so as to be extended over the second via 116.

Regarding the semiconductor device 100 according to this embodiment, a second via that serves as a dummy via may be simultaneously formed when forming a first via for the purpose of connecting an underlying interconnect and an upper layer interconnect, so as to suppress an increase in contact resistance between the first via and the underlying interconnect. Since the location of the second via is not specifically delimited, such arrangement allows inhibiting an increase in contact resistance between a first via and an underlying interconnect in a semiconductor device, through a simple process without any additional processing step.

EXAMPLE

First Example

Figure 4A:
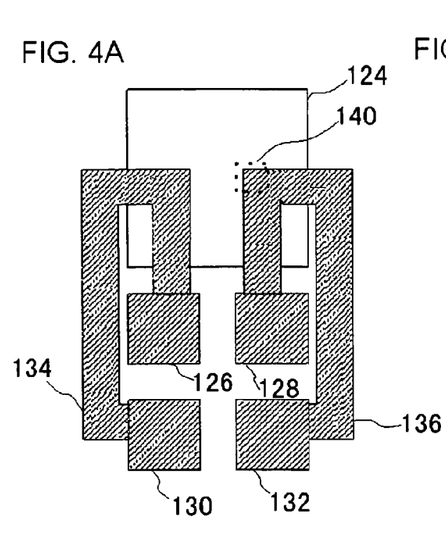
FIGS. 4A and 4B are schematic plan views showing an interconnect pattern according to an example of the present invention.
Figure 4B:
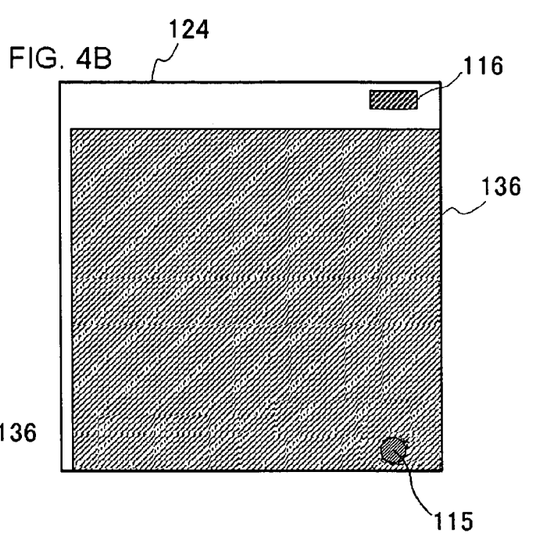

FIGS. 4A and 4B are schematic plan views showing an interconnect pattern according to this example. FIG. 4A depicts an entirety of the interconnect pattern, while FIG. 4B is an enlarged view of the portion enclosed by dotted lines 140 in FIG. 4A.

The interconnect pattern included an underlying metal 124 provided on a silicon wafer, an upper layer first terminal 126, an upper layer second terminal 128, an upper layer third terminal 130, and an upper layer fourth terminal 132 provided on the underlying metal 124, an upper layer first interconnect 134 connecting the upper layer first terminal 126 and the upper layer third terminal 130, and an upper layer second interconnect 136 connecting the upper layer second terminal 128 and the upper layer fourth terminal 132. The underlying metal 124 was composed of aluminum and a barrier metal layer (Ti film and TiN film). As shown in FIG. 4B, the upper layer second interconnect 136 was connected to the underlying metal 124 through the first via 115. Though not shown, the upper layer first terminal 126 was also connected to the underlying metal 124 through a via of the same size as the first via 115. The underlying metal 124 was additionally connected to the second via 116, which has a larger cross-sectional area than the first via 115. It is to be noted that the second via 116 was not connected to the upper layer second interconnect 136.

Figure 5:
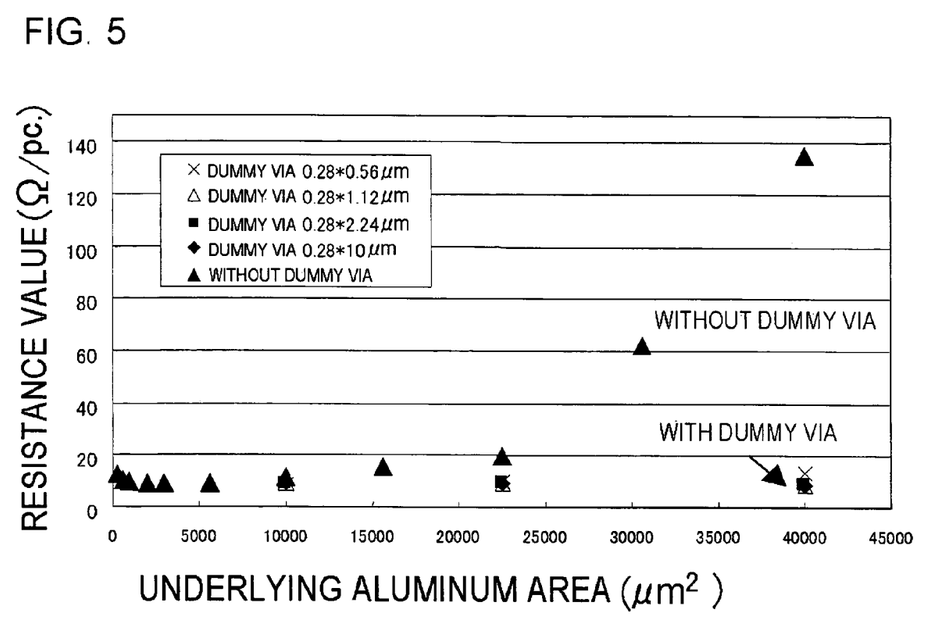
FIG. 5 is a graph showing resistance values between an upper layer first terminal and an upper layer second terminal with respect to different areas of an underlying metal according to the example.

FIG. 5 is a graph showing resistance values between the upper layer first terminal 126 and the upper layer second terminal 128 with respect to different area sizes of the underlying metal 124, in the interconnect pattern thus configured. Here, the diameter of the first via 115 was set to be 0.28 μm, and the area of the dummy via 116 was set to be 0.28×0.56 μm, 0.28×1.12 μm, 0.28×2.24 μm, and 0.28×10 μm. Also, the resistance values between the upper layer first terminal 126 and the upper layer second terminal 128 have been measured in the absence of the second via 116, with respect to the same interconnect pattern.

As is apparent from FIG. 5, the resistance value between the upper layer first terminal 126 and the upper layer second terminal 128 becomes larger with an increase in size of the underlying metal 124, in the absence of the second via 116. When the second via 116 is provided, the resistance value between the upper layer first terminal 126 and the upper layer second terminal 128 barely increases even though the underlying metal 124 becomes larger.

In view of such results, it is considered that underlying metal 124 becomes more susceptible to being charged with an increase in area thereof, and that underlying metal 124 at the bottom portion of the via hole incurs deterioration when exposed in the process of forming the via hole for the first via 115, when the second via 116 is not provided. On the other hand, when the second via 116 is provided, since the underlying metal 124 in the via hole for the second via 116 is exposed first, the charge of the underlying metal 124 is removed at that moment and hence the underlying metal 124 does not incur deterioration when exposed in the via hole for the first via 115, despite that the underlying metal 124 is charged and has a greater area. Accordingly, it has been proven that such arrangement allows suppressing an increase in contact resistance between the underlying metal 124 and the first via 115.

Second Example

Various MOSs (metal oxide semiconductors) each having a different capacitance value were formed on a silicon wafer. The MoSs were formed such that each having a different MOS capacitance area or gate oxide layer thickness. Each of the MOSs was connected through connection vias to two metal layers provided on each of the MOSs. Then resistance values between the two metal layers have been measured, with and without the presence of a dummy via having a larger diameter than the connection via. As a result, it has been confirmed that an increase in resistance in the pattern including the dummy via is smaller than in the pattern without the dummy via, when the capacitance values were same.

Although the embodiment and examples according to the present invention have been described referring to the drawings, it is to be understood that they are only exemplary and that various modification may be made to the foregoing structure.

While a via is provided in an underlying interconnect according to the foregoing embodiment, the present invention may be applied to formation of a via on an electrode. For example, the present invention is applicable to formation of a connection via constituted of tungsten on a capacitor that includes a first electrode constituted of a well provided on a silicon substrate, and a second electrode constituted of polysilicon provided thereon via a silicon oxide layer. In this case, if the polysilicon is charged when forming a via hole thereon, a reaction takes place between an etching gas and the polysilicon, which may result in formation of an oxide layer on the second electrode, and thus in an increase in contact resistance with the via. However, introducing the method according to the present invention allows suppressing the increase in contact resistance between the via and the second electrode.

It is apparent that the present invention is not limited to the above embodiment, that may be modified and changed without departing from the scope and spirit of the invention.

What is claimed is:

1. A semiconductor device comprising:
    a semiconductor substrate;
    a lower interconnect layer having a height measured orthogonally from said substrate and a width measured parallel to an upper surface of said substrate, said width being greater than said height,
    said lower interconnect layer comprised of a first barrier metal layer, an interconnect metal layer formed contacting the first barrier metal layer, and a second barrier metal layer formed contacting the interconnect metal layer;
    an interlayer dielectric formed contacting said second barrier metal layer;
    a first via opening and a second via opening located within said interlayer dielectric and extending into said second barrier metal layer, the second via opening formed with a larger bottom area than a bottom area of the first via opening;
    a first via of conductive material filling said first via opening and a second via of the conductive material filling said second via opening, a bottom area of the first via being less than a bottom area of the second via; and
    an upper interconnect layer including a third barrier metal layer contacting said interlayer dielectric, a second interconnect metal layer contacting said third barrier metal layer, and a fourth barrier metal layer contacting said third barrier metal layer,
    said upper interconnect layer formed contacting said first via and free of contact with said second via so that said lower interconnect layer and said upper interconnect layer are electrically connected through the first via and not electrically connected through said second via, said first via and said second via being electrically connected by said lower interconnect layer.

2. The semiconductor device according to claim 1, wherein said second via is a dummy via not electrically connected to said another conductor.

3. The semiconductor device according to claim 1, wherein said interconnect metal layer is constituted of aluminum, copper, silver, or an alloy containing one or more of these metals.

4. The semiconductor device according to claim 1, wherein said first barrier metal layer includes a titanium nitride layer.

5. The semiconductor device according to claim 3, wherein said first barrier metal layer includes a titanium nitride layer.

6. The semiconductor device according to claim 1, wherein said first via and said second via include tungsten.

7. The semiconductor device of claim 1, wherein, said upper layer interconnect extends over said second via.

8. The semiconductor device of claim 1, wherein, said second via is a dummy via.

9. The semiconductor device of claim 4, wherein said interconnect metal layer is constituted of aluminum.

10. A semiconductor device comprising:
a semiconductor substrate;
a lower interconnect layer having a height measured orthogonally from said substrate and a width measured parallel to an upper surface of said substrate, said width being greater than said height, said lower interconnect layer comprised of a first barrier metal layer, an interconnect metal layer formed contacting the first barrier metal layer, and a second barrier metal layer formed contacting the interconnect metal layer;
an interlayer dielectric formed contacting said second barrier metal layer;
a first via opening and a second via opening located within said interlayer dielectric and extending into said second barrier metal layer;
a first via of conductive material filling said first via opening and a second via of the conductive material filling said second via opening, a bottom area of the first via being less than a bottom area of the second via; and
an upper interconnect layer contacting said interlayer dielectric, contacting said first via, and free of contact with said second via so that said lower interconnect layer and said upper interconnect layer are electrically connected through the first via and not electrically connected through said second via, said first via and said second via being electrically connected by said lower interconnect layer.

11. The semiconductor device according to claim 10, wherein said interconnect metal layer is constituted of aluminum, copper, silver, or an alloy containing one or more of these metals.

12. The semiconductor device according to claim 10, wherein said first barrier metal layer includes a titanium nitride layer.

13. The semiconductor device according to claim 10, wherein said first via and said second via include tungsten.

14. The semiconductor device of claim 10, wherein, said upper layer interconnect extends over said second via.

15. The semiconductor device of claim 10, wherein, said second via is a dummy via suppressing a contact resistance between the first via and the lower interconnect layer.

16. The semiconductor device of claim 12, wherein said interconnect metal layer is constituted of aluminum.

* * * * *